United States Patent
Geng et al.

(10) Patent No.: US 8,347,178 B2
(45) Date of Patent: Jan. 1, 2013

(54) METHOD, DEVICE AND APPARATUS FOR CORRECTING BURSTS

(75) Inventors: Dongyu Geng, Shenzhen (CN); Raymond W. K. Leung, Shenzhen (CN); Dongning Feng, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 182 days.

(21) Appl. No.: 12/982,617

(22) Filed: Dec. 30, 2010

(65) Prior Publication Data

US 2011/0131469 A1      Jun. 2, 2011

Related U.S. Application Data

(63) Continuation of application No. PCT/CN2009/071427, filed on Apr. 23, 2009.

(30) Foreign Application Priority Data

Jul. 4, 2008   (CN) .......................... 2008 1 0132995

(51) Int. Cl.
*H03M 13/00* (2006.01)
(52) U.S. Cl. ........................................................ 714/762
(58) Field of Classification Search .................. 714/762, 714/788, 800–801
See application file for complete search history.

(56) References Cited

U.S. PATENT DOCUMENTS

| | | | |
|---|---|---|---|
| 7,805,652 B1 * | 9/2010 | Varnica | 714/752 |
| 2007/0011565 A1 | 1/2007 | Kim et al. | |
| 2009/0063930 A1 * | 3/2009 | Matsumoto et al. | 714/752 |

FOREIGN PATENT DOCUMENTS

| | | |
|---|---|---|
| CN | 1399815 A | 2/2003 |
| WO | WO 2005/053165 A1 | 6/2005 |

OTHER PUBLICATIONS

Kim et al., Overlapped decoding of class of quasi-cyclic LDPC codes, 2003, IEEE, p. 113-117.*
Paolini et al., Construction of near optimum burst erasure correction low density parity check codes, Oct. 2008, IEEE Trans. on Comm., p. 1-15.*
International Search Report dated Jul. 16,2009 in connection with International Patent Application No. PCT/CN2009/071427.

* cited by examiner

*Primary Examiner* — Shelly A Chase

(57) ABSTRACT

A method, a device, and an apparatus for correcting bursts are disclosed. The method includes: calculating a correction vector according to a received codeword and a check matrix, wherein the check matrix is an Overlapped Quasi Dual Diagonal Matrix; determining a length and position of a burst according to a longest zero element vector between two nonzero elements in the correction vector when the correction vector is nonzero; and calculating out an error mode according to the correction vector and the length of the burst, obtaining an error mode polynomial according to the error mode, correcting the received codeword according to the error mode polynomial, and obtaining a corrected codeword polynomial. The PBC-based implementation method for cyclic codes herein can correct more burst errors than the conventional cyclic code decoding method.

21 Claims, 15 Drawing Sheets

METHOD, DEVICE AND APPARATUS FOR CORRECTING BURSTS

CROSS-REFERENCE TO RELATED APPLICATIONS

This application is a continuation of International Application No. PCT/CN2009/071427, filed on Apr. 23, 2009, which claims priority to Chinese Patent Application No. 200810132995.1, filed on Jul. 4, 2008, both of which are hereby incorporated by reference in their entireties.

TECHNICAL FIELD

The present invention relates to communications technologies, and in particular, to a method, a device, and an apparatus for correcting bursts.

BACKGROUND

In the process of data storing and transmission, the factors such as linear noise, out-of-sync in the demodulation process, deep fading and multi-path propagation in the wireless transmission, and track defect in the magnetic storage give rise to strings of paroxysmal transmission errors, which are called "bursts". A burst whose length is l may be defined as a vector, and its non-0 elements are limited to l continuous positions. Generally, bits designed to correct random errors are inefficient in correcting bursts. Therefore, research for burst correction codes are very important, and burst correction codes have been widely applied to the communication system and the storage system.

There is a method for correcting burst errors in the prior art. In the method, a code with a correction capability "l" can correct bursts whose length is l or shorter, but cannot correct the bursts whose length is l+1. Such a correction mode is known as Deterministic Burst Correction (DBC). The highest correction capability of a DBC can be calculated according to a formula of $[(n-k)/2]$ (n is length of correction codes of the DBC, k is information length of correction codes of the DBC), the upper limit of the correction capability of the DBC is known as "Reiger Bound". There is another burst correction way in the prior art, known as "Probabilistic Burst Correction" (PBC), by using which, longer bursts can be corrected at a high probability. Thus, the PBC is more powerful than the DBC, and is very promising burst correction method.

Cyclic codes are an important subtype of linear block code, and are most frequently applied to the engineering. Cyclic shift of each codeword of a cyclic code is still a codeword of the code. Due to cyclic characteristics of cyclic codes, the cyclic codes can be encoded by a generation polynomial serving as a feedback shift register of a feedback coefficient, or by multiplication of a generation matrix and an information vector; the corrector of the decoder may be calculated out by a check polynomial serving as a feedback shift register of a feedback coefficient, or by multiplication of a check matrix and a codeword vector. Because cyclic codes have a rigorous algebraic structure, the cyclic codes may be decoded in many methods, for example, error-trapping decoding algorithm, majority-logic decoding algorithm, trellis decoding algorithm of linear block codes, broad-sense minimum distance decoding algorithm, Chase decoding algorithm, and maximum-likelihood decoding algorithm. Cyclic decoding is widely applied to error control of the communication system, and is especially effective in error detection.

Currently, the PBC method of linear codes provides only an ideal approach to probabilistic burst correction of linear codes, but does not provide specific implementation method or detailed decoding process intended for a specific code type such as cyclic codes or Low Density Parity Check (LDPC) codes.

SUMMARY

The embodiments of the present invention provide a method, a device and an apparatus for burst correction to implement probabilistic burst correction for cyclic codes.

A burst correction method provided in an embodiment of the present invention includes:

calculating a correction vector according to a received codeword and a check matrix, where the check matrix is an Overlapped Quasi Dual Diagonal Matrix;

determining a length and position of a burst according to a longest zero element vector between two nonzero elements in the correction vector when the correction vector is nonzero; and calculating out an error mode according to the correction vector and the length of the burst, obtaining an error mode polynomial according to the error mode, correcting the received codeword according to the error mode polynomial, and obtaining a corrected codeword polynomial.

A burst correction decoder provided in an embodiment of the present invention includes:

a check matrix generating module, configured to construct a check matrix, where the check matrix is an Overlapped Quasi Dual Diagonal Matrix;

a corrector generating module, configured to calculate a correction vector according to a received codeword and the check matrix constructed by the check matrix generating module;

a burst position and length detecting module, configured to determine a position of a burst according to a longest zero element vector between two nonzero elements in the correction vector when the correction vector generated by the corrector generating module is nonzero;

an error mode calculating module, configured to calculate out an error mode according to the correction vector and the burst length determined by the burst position and length detecting module, and obtain an error mode polynomial according to the error mode; and an error correcting module, configured to correct the received codeword according to the error mode polynomial obtained by the error mode calculating module, and obtain a corrected codeword polynomial.

A decoding apparatus provided in an embodiment of the present invention includes:

a data receiving module, configured to receive a codeword sent through a channel;

a decoder type selecting module, configured to select a decoder according to a type of the channel; and a burst correction decoder decoding module, configured to: construct a check matrix after the decoder type selecting module selects a burst correction decoder; calculate a correction vector according to the received codeword and the check matrix, where the check matrix is an Overlapped Quasi Dual Diagonal Matrix; determine a length and position of the burst according to a longest zero element vector between two nonzero elements in the correction vector when the correction vector is nonzero; calculate out an error mode according to the correction vector and the length of the burst, obtain an error mode polynomial according to the error mode, correct the received codeword according to the error mode polynomial, and obtain a corrected codeword polynomial.

A decoding apparatus provided in an embodiment of the present invention includes: a data receiving module, a burst correction decoder decoding module, a decoding result judging module, an outputting module, and a conventional decoder decoding module.

The data receiving module is configured to receive a codeword sent through a channel.

The burst correction decoder decoding module is configured to: construct a check matrix; calculate a correction vector according to the codeword received by the data receiving module and the check matrix, where the check matrix is an Overlapped Quasi Dual Diagonal Matrix; determine a length and position of a burst according to a longest zero element vector between two nonzero elements in the correction vector when the correction vector is nonzero; calculate out an error mode according to a correction vector that is determined according to the length and the position of the burst, obtain an error mode polynomial according to the error mode, correct the received codeword according to the error mode polynomial, and obtain a corrected codeword polynomial.

The decoding result judging module is configured to: send the codeword decoded by the burst correction decoder decoding module to the outputting module for outputting if the burst correction decoder decoding module succeeds in decoding; and send the codeword decoded by the burst correction decoder decoding module to the conventional decoder decoding module for decoding if the burst correction decoder decoding module fails in decoding.

In the embodiments of the present invention, the correction vector is calculated according to the received codeword and the check matrix. The check matrix is an Overlapped Quasi Dual Diagonal Matrix. The length and the position of the burst are determined according to the longest zero element vector between two nonzero elements in the correction vector when the correction vector is nonzero; the error mode is calculated out according to a correction vector, an error mode polynomial is obtained according to the error mode, the received codeword is corrected according to the error mode polynomial, and the corrected codeword polynomial is obtained. The embodiments of the present invention put forward a PBC-based method specific to cyclic codes, and the method can correct more burst errors than the conventional cyclic code decoding method.

DETAILED DESCRIPTION

The embodiments of the present invention put forward a burst correction method, namely, a PBC-based method specific to cyclic codes. The burst correction method put forward herein is applicable to all codes that fulfill the cyclic code characteristics, for example, Reed Solomon (RS) codes, and Bose Chaudhuri Hocquenghem (BCH) codes.

Errors tend to occur in the transmitted codeword. An error polynomial may be:

$$e(x)=e_{l-(L-1)}x^{l-(L-1)}+e_{l-(L-2)}x^{l-(L-2)}+\Lambda+e_l x^l \quad (2)$$

In formula (2), L is the length of the burst, and $l-(L-1)$ is the start position of the burst; $e_{l-(L-1)}$ is the value of the first error of the burst.

The polynomial r(x) of the receiving sequence may be:

$$r(x)=c(x)+e(x) \quad (3)$$

In formula (3), $c(x)=c_{n-1}x^{n-1}+c_{n-2}x^{n-2}+\Lambda+c_1 x+c_0$ is the coded codeword.

Figure 1:
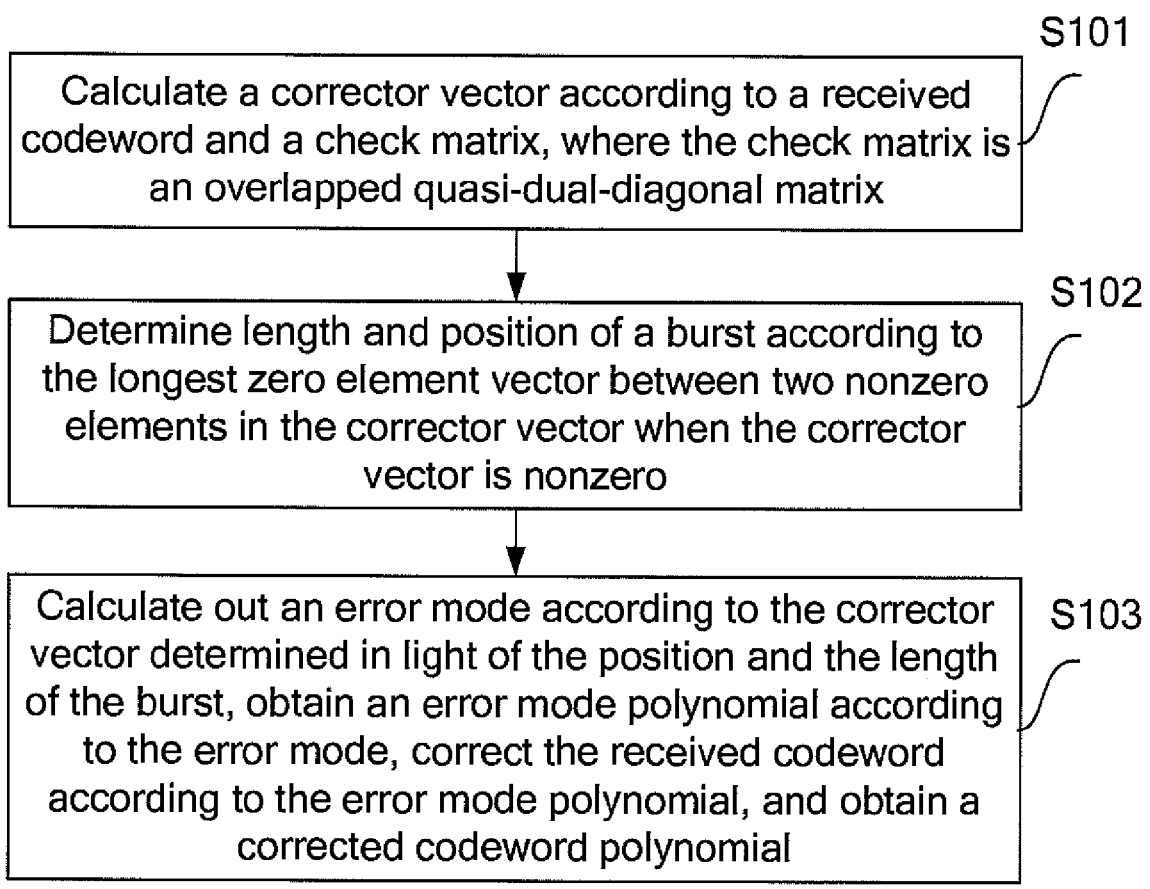
FIG. 1 is a flowchart of a burst correction method in an embodiment of the present invention.

FIG. 1 is a flowchart of a burst correction method in an embodiment of the present invention. The method includes the following blocks:

Block S101: Calculate a correction vector according to a received codeword and a check matrix, where the check matrix is an Overlapped Quasi Dual Diagonal Matrix.

The check matrix is composed of cyclic codes whose codeword length is N and whose information length is K. The elements in the last (N-K) rows are the same as the elements in the first (N-K) rows of the check matrix. The elements are 0 in the area between the main diagonal of the N×N matrix formed by the first N rows of the matrix and the main diagonal of the N×N matrix formed by the last N rows of the check matrix.

Block S102: When the correction vector is nonzero, determine a length and position of a burst according to the longest zero element vector between two nonzero elements in the correction vector; and when the correction vector is a zero vector, it indicates that the received data is a legal codeword, and the decoded codeword is output directly.

Block S103: Calculate out an error mode according to the correction vector and the length of the burst, obtain an error mode polynomial according to the error mode, correct the received codeword according to the error mode polynomial, and obtain the corrected codeword polynomial, thus finishing decoding of the received data whose length is a codeword.

The error mode may be calculated in the following way:

Calculate the current error mode through iteration according to the coefficient of the check polynomial of the cyclic codes, the correction vector, the length of the burst, and the previous error mode calculated out; or obtain a check coefficient tap vector through iteration according to the coefficient of the check polynomial of the cyclic codes, and calculate the current error mode concurrently according to the check coefficient tap vector and the correction vector that is determined according to the length and the position of the burst; or calculate the current error modes concurrently according to the coefficient of the generation polynomial of the cyclic codes and the correction vector that is determined according to the length and the position of the burst.

By using the burst correction method provided in the embodiment above, the correction vector is calculated according to the received codeword and the check matrix. The check matrix is an Overlapped Quasi Dual Diagonal Matrix. The length and the position of the burst are determined according to the longest zero element vector between two nonzero elements in the correction vector when the correction vector is nonzero; the error mode is calculated out according to a part of the correction vector that is determined according to the position of the burst, an error mode polynomial is obtained according to the error mode, the received codeword is corrected according to the error mode polynomial, and the corrected codeword polynomial is obtained. The PBC-based implementation method specific to cyclic codes in an embodiment of the present invention can correct more burst errors than the conventional cyclic code decoding method.

Figure 2:
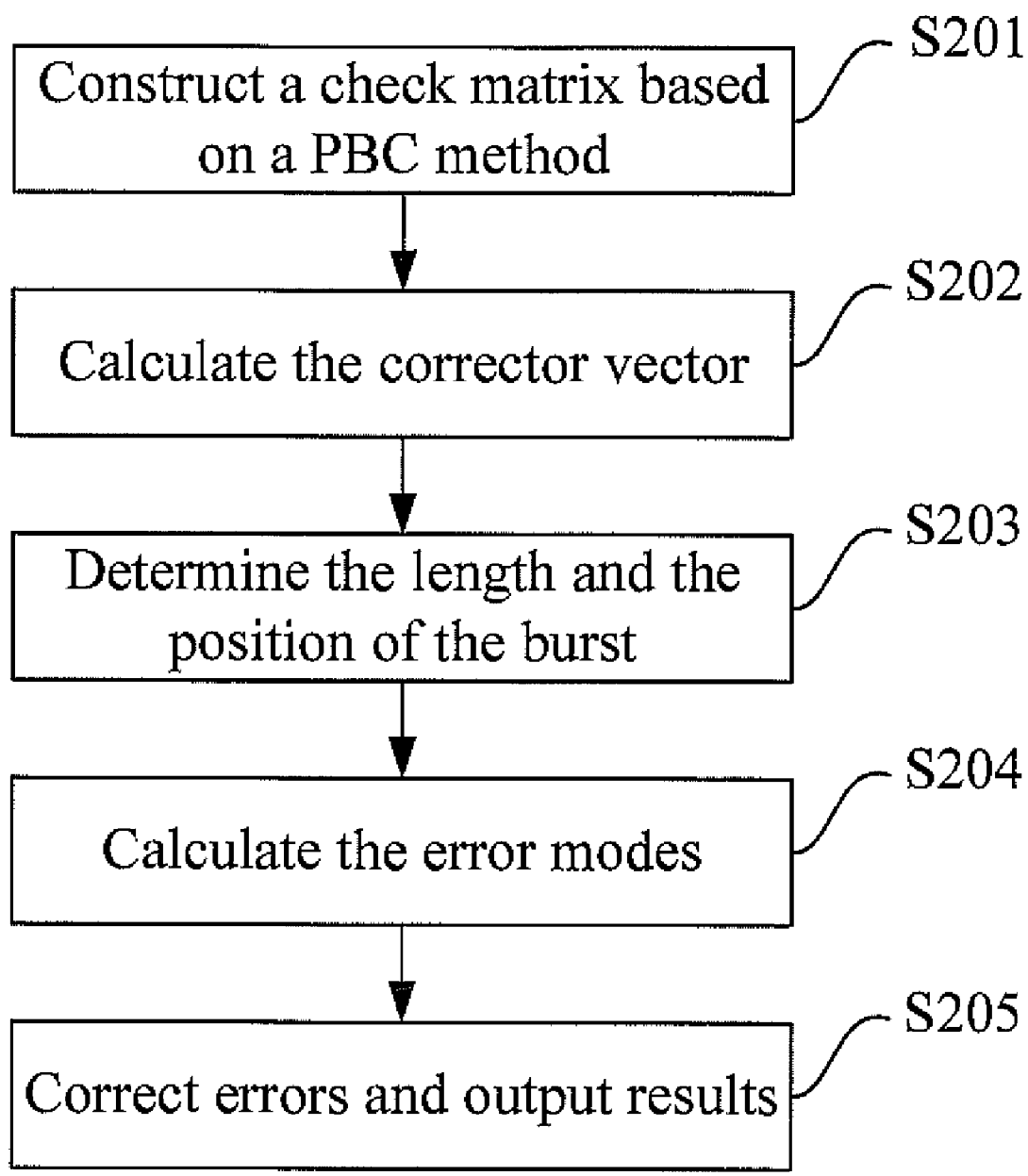
FIG. 2 is a flowchart of a burst correction method in a first embodiment of the present invention.

FIG. 2 is a flowchart of a burst correction method in a first embodiment of the present invention. The method includes the following blocks:

Block S201: Construct a PBC-based check matrix. In this embodiment, a PBC-based check matrix is called a check matrix in an extended burst correction form, and is expressed as $H_{eBCF}$ for brevity of description.

This embodiment puts forward a method of constructing a $H_{eBCF}$ check matrix whose size is $(2N-K) \times N$ based on PBC for cyclic codes.

For an (N,K) cyclic code whose codeword length is N and whose information length is K, it is assumed that its check polynomial is $h(x)=h_0+h_1x+h_2x^2+\Lambda+h_Kx^K$. The $H_{eBCF}$ check matrix constructed in this embodiment is based on coefficients of the check polynomial, and is expressed as:

$$H_{eBCF} = \begin{bmatrix} h_0 & h_1 & h_2 & L & L & h_K & 0 & 0 & L & L & 0 & 0 \\ 0 & h_0 & h_1 & h_2 & L & L & h_K & 0 & 0 & L & L & 0 \\ & & O & & & & & O & & & & \\ h_1 & h_2 & L & L & h_K & 0 & 0 & L & L & 0 & 0 & h_0 \\ h_0 & h_1 & h_2 & L & L & h_K & 0 & 0 & L & L & 0 & 0 \\ 0 & h_0 & h_1 & h_2 & L & L & h_K & 0 & 0 & L & L & 0 \\ & & O & & & & & O & & & & \\ 0 & 0 & L & L & 0 & 0 & h_0 & h_1 & h_2 & L & L & h_K \end{bmatrix}_{(2N-K) \times N}$$

In the $H_{eBCF}$ check matrix above, the first K+1 columns of the first row are composed of the coefficients of the check polynomial, namely, the first K+1 columns are $h_0$, $h_1$, $\Lambda$, $h_K$ (or $h_k$, $h_{k-1}$, L, $h_1$, $h_0$), and the last N−K−1 columns are all 0s.

Afterward, the elements in the first row of the check matrix shift rightward cyclically by 1 bit to make up the second row of the matrix; the elements in the second row of the check matrix shift rightward cyclically by 1 bit to make up the third row of the check matrix, and so on, thus making up the first N rows of the check matrix. The elements in the last N−K rows of the check matrix are the same as the elements in the first N−K rows.

The $H_{eBCF}$ matrix satisfies the following characteristics:

(1) All elements on the diagonal D1 of the N×N matrix formed by the first N rows of the $H_{eBCF}$ matrix are $h_0$ (or $h_k$).

(2) All elements on the diagonal D2 of the N×N matrix formed by the last N rows of the $H_{eBCF}$ matrix are $h_k$ (or $h_0$).

(3) All elements in the area between diagonal D1 and diagonal D2 of the $H_{eBCF}$ matrix are "0".

The $H_{eBCF}$ matrix that satisfies the foregoing characteristics is defined as the Overlapped Quasi Dual Diagonal Matrix herein.

Nevertheless, the embodiments of the present invention are not limited to the foregoing description. At the constructing the first N rows of $H_{eBCF}$, the current row is not necessarily obtained by shifting the coefficients of the check polynomial of the previous row cyclically by one bit, but may be obtained by shifting the coefficients of the check polynomial of the previous row cyclically by a fixed number of bits. In other embodiments, rows or columns of the aforementioned check matrix may also be changed for obtaining a different check matrix.

After the cyclic codeword (N,K) is determined, the generation polynomial g(x) of the cyclic codeword is determined uniquely. Afterward, the check polynomial h(x) is determined according to the relation between the check polynomial h(x) and the generation polynomial g(x). Nevertheless, the method of determining h(x) is not limited to that. In the one embodiment of the invention, the relation between the check polynomial h(x) and the generation polynomial g(x) is shown in formula (4):

$$g(x)h(x)=x^n+1 \quad (4)$$

For the shortened cyclic code (N−s,K−s), its $H_{eBCF}$ check matrix may be obtained by deleting the last s rows and the last s columns of the $H_{eBCF}$ check matrix corresponding to the cyclic code (N,K).

Block S202: Calculate the correction vector. When the correction vector is nonzero, perform block S203; when the correction vector is zero, output the received codeword directly because the received data is a legal codeword.

Assuming that the received codeword vector is r, the correction vector $s=(s_0, s_1, \Lambda, s_{2N-K-1})$ may be calculated out according to the following formula:

$$s=rH_{eBCF}^T \quad (5)$$

Block S203: Determine the length and the position of the burst.

It is assumed that the last bit of the burst exists on l, and the length of the burst is L, where $L \leq \min\{N-K, l\pm 1\}$. The burst mode is $(e_{l-(L-1)} \neq 0, \Lambda, e_{l-1}, e_l \neq 0)$, and the correction vector of the burst satisfies:

$$\begin{cases} s_l \neq 0 \\ s_{l+j} = 0 \\ s_{l+N-K-L+1} \neq 0 \end{cases}$$

$$1 \leq j \leq N - K - L.$$

In this embodiment, the length and the position of the burst are determined according to the longest zero element sequence between two nonzero elements in the correction vector.

Block S204: Calculate the error mode.

After the position and the length of the burst are determined, the error mode of the burst can be calculated out according to the length of the burst and the correct vector. This embodiment puts forward two methods for calculating the error mode: calculating the error modes serially, and calculating the error modes concurrently.

Method One: Calculate the error modes serially.

The first method of calculating the error modes is to calculate the error modes serially. After block S203, the longest zero element sequence between two nonzero elements is determined, namely, $s_l$, $s_{l+1}$, $s_{l+2}$, $\Lambda s_{l+N-K-L+1}$ is also determined accordingly. In the serial correction method, the calculation of each error value is related to the coefficient of the check polynomial, the correction vector, and multiple error values subsequent to this error. The error modes are calculated according to the following formula:

$$e_{l-1-j} = h_0^{-1}\left(\sum_{i=1}^{j-1} h_{j-i}e_{l-1-i} + s_{l-1-j}\right) \quad (6)$$

In formula (6), j=−1, 0, Λ, L−2; $h_0$, $h_1$, Λ are coefficients of the check polynomial h(x); for ordinary cyclic codes, $h_0$=1. First, $s_l$ obtained in block S203 is substituted into formula (6). That is, when j=−1, the first error mode is $e_l=s_l$. Afterward, $e_l$ and $s_{l-1}$ are substituted into formula (6). That is, when j=0, the second error mode is $e_{l-1}=h_l e_l+s_{l-1}$. Likewise, all error modes are calculated out.

This embodiment provides an inherent relation between the error mode and the correction vector. However, the embodiments of the present invention are not limited to that. All variations of the formulas involved herein shall fall within the protection scope of the present invention.

Figure 3:
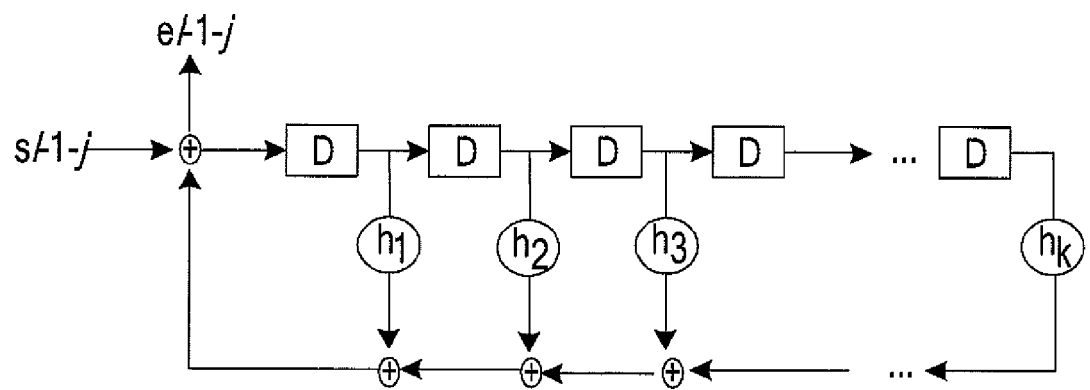
FIG. 3 is a circuit diagram of calculating out error modes serially in an embodiment of the present invention.

FIG. 3 is a circuit diagram of calculating out error modes serially in an embodiment of the present invention. First, all shift registers in the circuit are set to 0. The correction vector $s_{l-1-j}$ (j=−1, 0, Λ, L−2) obtained in block 3 is fed into the shift register in the circuit to calculate out the error mode.

Method Two: Calculate the error modes concurrently.

In the method of calculating the error modes serially, the calculation of the current error mode $e_j$ depends on the previous error mode $e_{j+1}$, which leads to a certain delay and reduces the decoding speed drastically. A method for calculating the error modes concurrently is put forward in an embodiment of the present invention. The concurrent calculation of the error modes depends on the check coefficient tap vector and the correction vector only. In this embodiment, a H vector is used for representing the check coefficient tap vector. That is, once the burst position and the burst length are determined in block S203, all error modes can be calculated out concurrently.

The following provides a detailed process of calculating the H vector put forward herein. The H vector is composed of $H_0$, $H_1 H_2$, Λ $H_{N-K-1}$. The process of calculating the H vector is expressed as:

$$\begin{cases} H_0 = h_0^{-1} = 1 \\ H_i = h_0^{-1}\sum_{j=1}^{i} h_j H_{i-j} \quad i = 1, 2, \ldots N-K-1 \end{cases} \quad (7)$$

In formula (7), the detailed calculation process is:
i=0 $H_0=h_0^{-1}$
i=1 $H_1=h_1 H_0$
i=2 $H_2=h_1 H_1+h_2 H_0$
i=3 $H_3=h_1 H_2+h_2 H_1+h_3 H_0$
...

Figure 4:
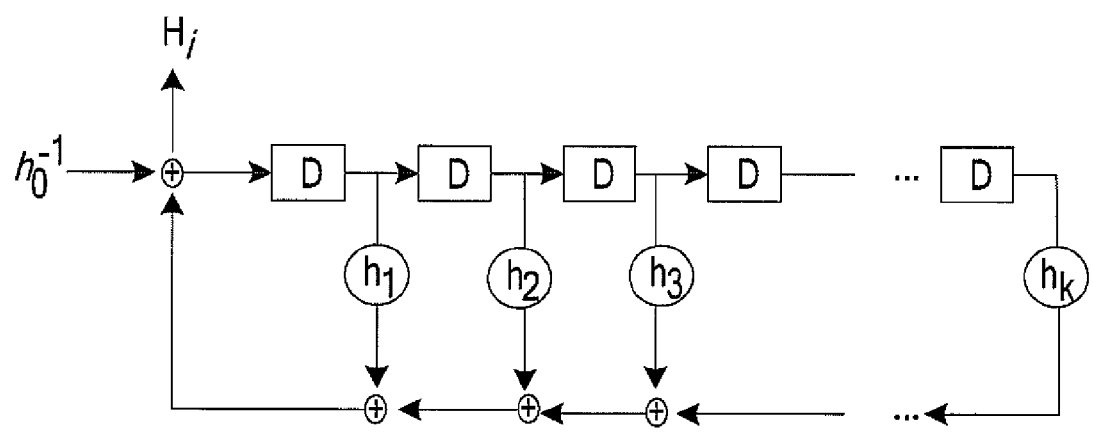
FIG. 4 is a circuit diagram of calculating out an H vector in an embodiment of the present invention.

FIG. 4 is a circuit diagram of calculating out H vectors in an embodiment of the present invention. In this embodiment, all shift registers in the circuit are initialized to 0 first, $h_0^{-1}$ is fed into the register, and $H_0=h_0^{-1}$ is output. Afterward, the shift register shifts 1 bit, and outputs $H_1=h_1 H_0$. This process goes on until all H vectors are output.

After the H vectors are calculated out, the error modes are calculated according to formula (8).

$$e_{l-1-j} = \left(\sum_{i=1}^{j-1} H_{j-i}s_{l-1-j}\right) \quad (8)$$

In formula (8), j=−1, 0, Λ, L−2. Formula (8) is expanded and the calculation results are:
j=−1 $e_l=s_l$
j=0 $e_{l-1}=H_1 s_l+s_{l-1}$,
j=1 $e_{l-2}=H_2 s_l+H_1 s_{l-1}+s_{l-2}$
j=2 $e_{l-3}=H_3 s_l+H_2 s_{l-1}+H_1 s_{l-2}+s_{l-3}$
...

Figure 5:
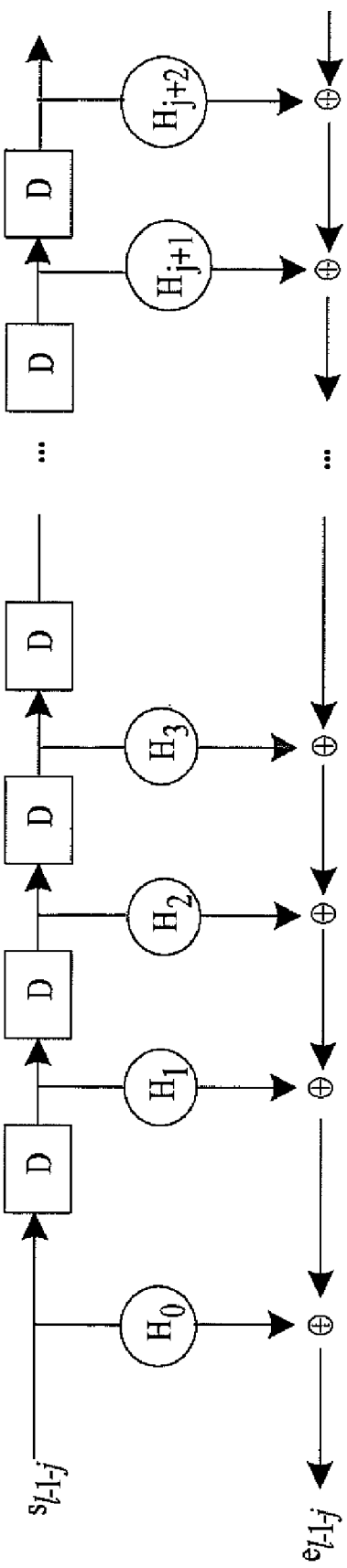
FIG. 5 is a circuit diagram of calculating out error modes concurrently in an embodiment of the present invention.

FIG. 5 is a circuit diagram of calculating out error modes concurrently in an embodiment of the present invention. First, all shift registers are initialized to 0, and $s_l$ is fed into the shift register to obtain the first error mode $e_l$. Afterward, $s_l$ is fed into the second shift register, and $s_{l-1}$ is fed into the first shift register at the same time to obtain the second error mode $e_{l-1}$. This process goes on until all shift registers are obtained.

Figure 6:
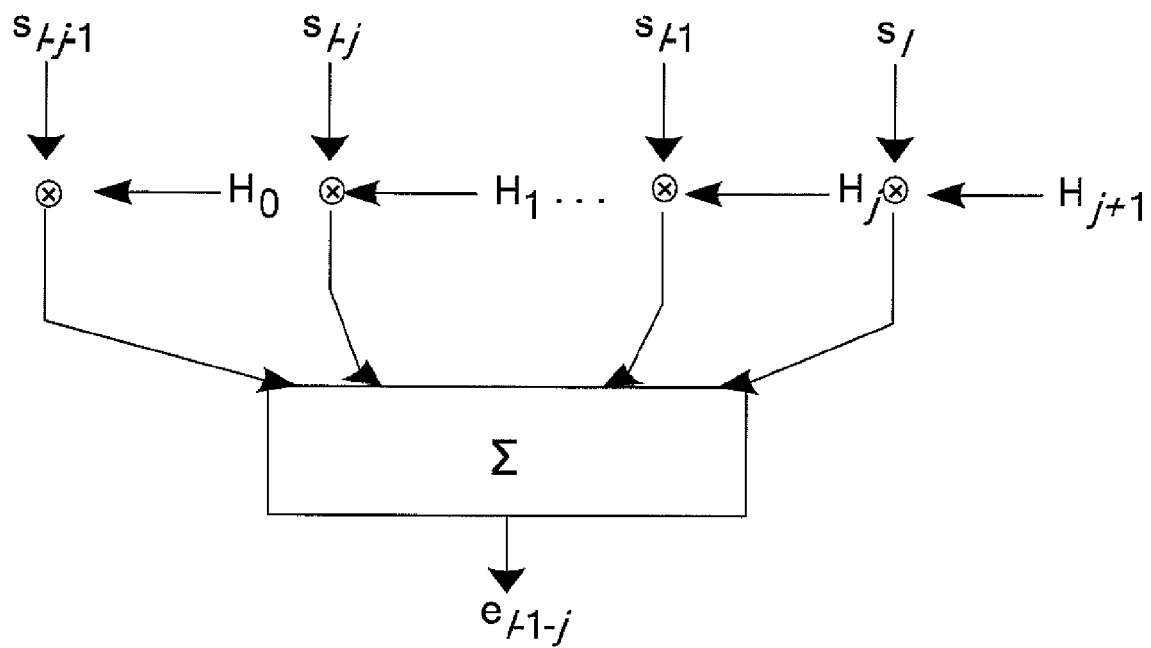
FIG. 6 is another circuit diagram of calculating out error modes concurrently in an embodiment of the present invention.

FIG. 6 shows another circuit for calculating error modes concurrently.

The following puts forward a simpler method of calculating the error modes concurrently on the basis of the foregoing method of calculating the error modes concurrently.

Assuming that the generation polynomial corresponding to the cyclic codes is $g(x)=g_0+g_1 x+\Lambda g_{n-k}x^{n-k}$, the error modes may be calculated concurrently according to the following formula:

$$e_{l-1-j} = \left(\sum_{i=1}^{j-1} g_{j-i}s_{l-1-i}\right) \quad (9)$$

In the formula above, j=−1, 0, Λ, L−2.

Figure 7:
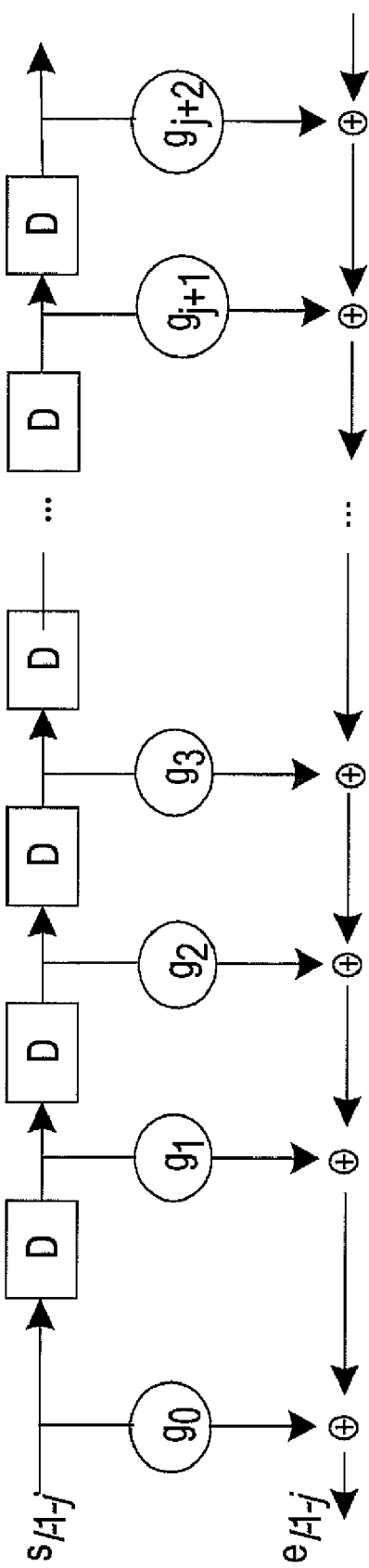
FIG. 7 is another circuit diagram of calculating out error modes concurrently in an embodiment of the present invention.
Figure 8:
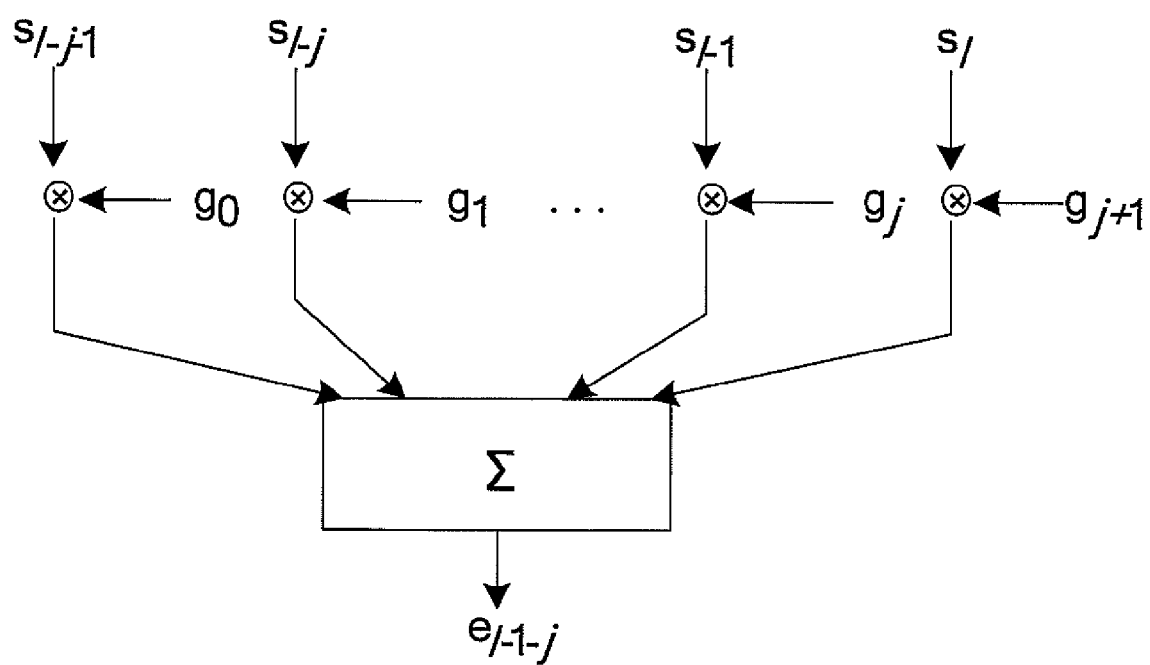
FIG. 8 is another circuit diagram of calculating out error modes concurrently in an embodiment of the present invention.

The circuits for calculating error modes concurrently are shown in FIG. 7 and FIG. 8.

Block S205: Correct the burst and output results.

Through block S204, all error modes $e_i$(i=l−(L−1), l−(L−2), Λ, l) are obtained, and the error mode polynomial e(x) is obtained accordingly.

After the error correction, the codeword polynomial r̂(x) may be obtained according to the following formula:

$$\hat{r}(x)=r(x)+e(x) \quad (10)$$

In the formula above, r(x) is the received data.

After the foregoing five blocks are performed, the PBC-based burst correction process is finished for the cyclic codes.

Figure 9:
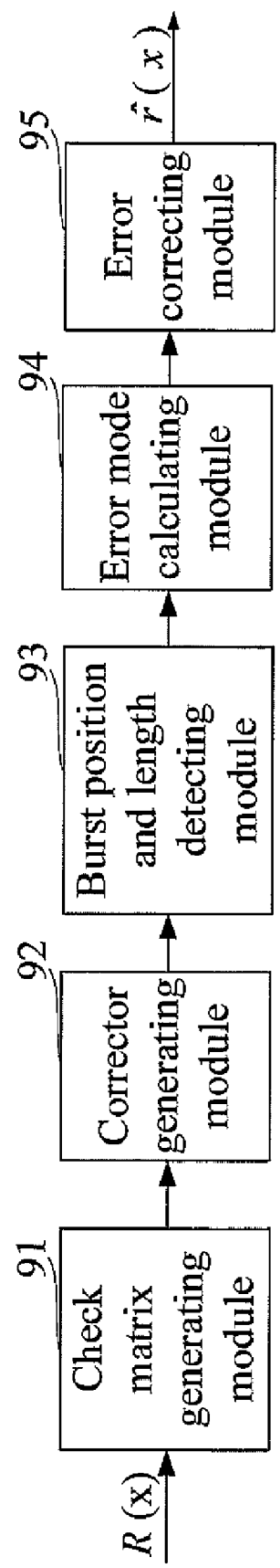
FIG. 9 shows a structure of a burst correction decoder in an embodiment of the present invention.

FIG. 9 shows a structure of a burst correction decoder in an embodiment of the present invention. The decoder includes:
a check matrix generating module 91, configured to construct a check matrix, where the check matrix is an Overlapped Quasi Dual Diagonal Matrix;
a corrector generating module 92, configured to calculate a correction vector according to a received codeword and the check matrix constructed by the check matrix generating module 91;

a burst position and length detecting module 93, configured to determine a length and position of a burst according to a longest zero element vector between two nonzero elements in the correction vector when the correction vector generated by the corrector generating module 92 is nonzero;

an error mode calculating module 94, configured to calculate out an error mode according to the correction vector and the burst length determined by the burst position and length detecting module 93, and obtain an error mode polynomial according to the error mode; and an error correcting module 95, configured to correct the received codeword according to the error mode polynomial obtained by the error mode calculating module 94, and obtain a corrected codeword polynomial.

Figure 10:
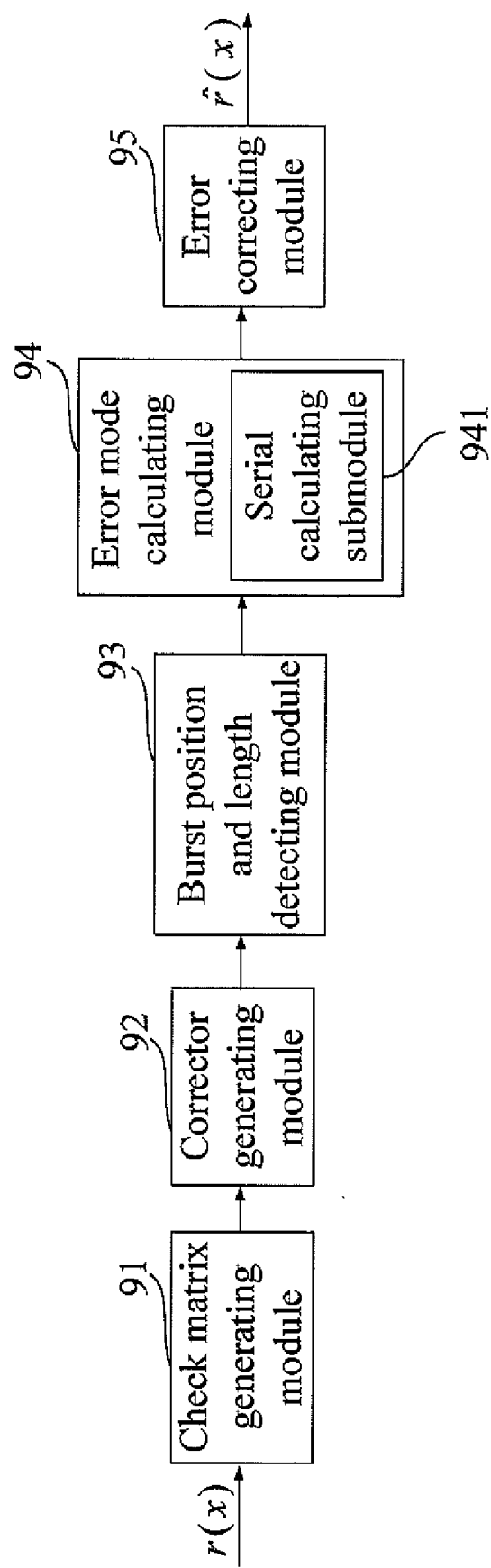
FIG. 10 shows a structure of a burst correction decoder in another embodiment of the present invention.

As shown in FIG. 10, in another embodiment of the present invention, the error mode calculating module 94 may include:

a serial calculating submodule 941, configured to calculate the current error mode through iteration according to the coefficients of the check polynomial of the cyclic codes, the correction vector that is determined according to the length and the position of the burst, and the previous error mode calculated out.

Figure 11:
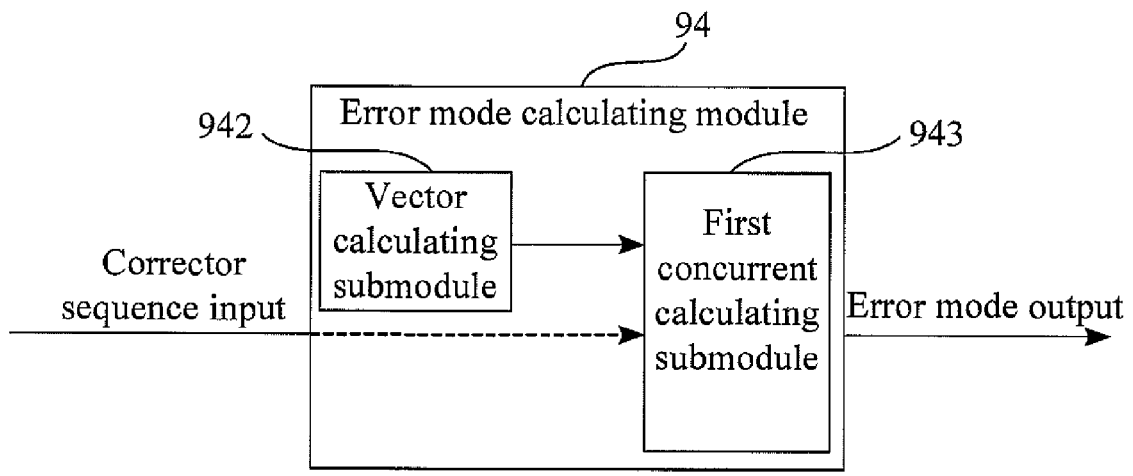
FIG. 11 shows a structure of an error mode calculating module in another embodiment of the present invention.

As shown in FIG. 11, in another embodiment of the present invention, the error mode calculating module 94 may include:

a vector calculating submodule 942, configured to obtain a check coefficient tap vector through iteration according to the coefficients of the check polynomial of the cyclic codes, where the check coefficient tap vector is represented by an H vector; and a first concurrent calculating submodule 943, configured to calculate the error modes concurrently according to the check coefficient tap vector obtained by the vector calculating submodule 942 and the correction vector that is determined according to the length and the position of the burst.

Figure 12:
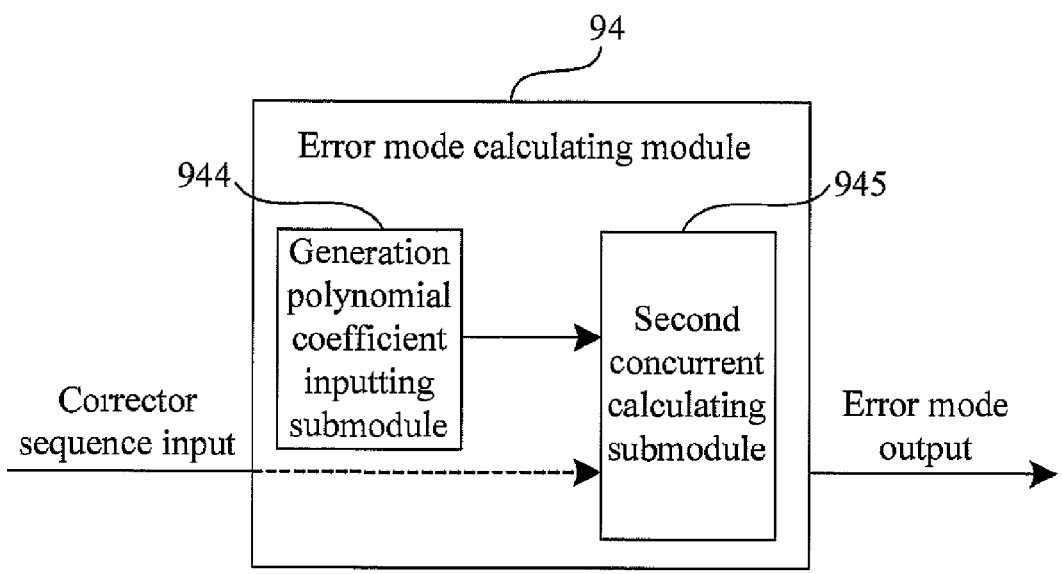
FIG. 12 shows a structure of an error mode calculating module in another embodiment of the present invention.

As shown in FIG. 12, in another embodiment of the present invention, the error mode calculating module 94 may include:

a generation polynomial coefficient inputting submodule 944, configured to input coefficients of the generation polynomial of cyclic codes; and a second concurrent calculating submodule 945, configured to calculate the error modes concurrently according to the generation polynomial coefficients input by the generation polynomial coefficient inputting submodule 944 and the correction vector that is determined according to the length and the position of the burst.

Figure 13:
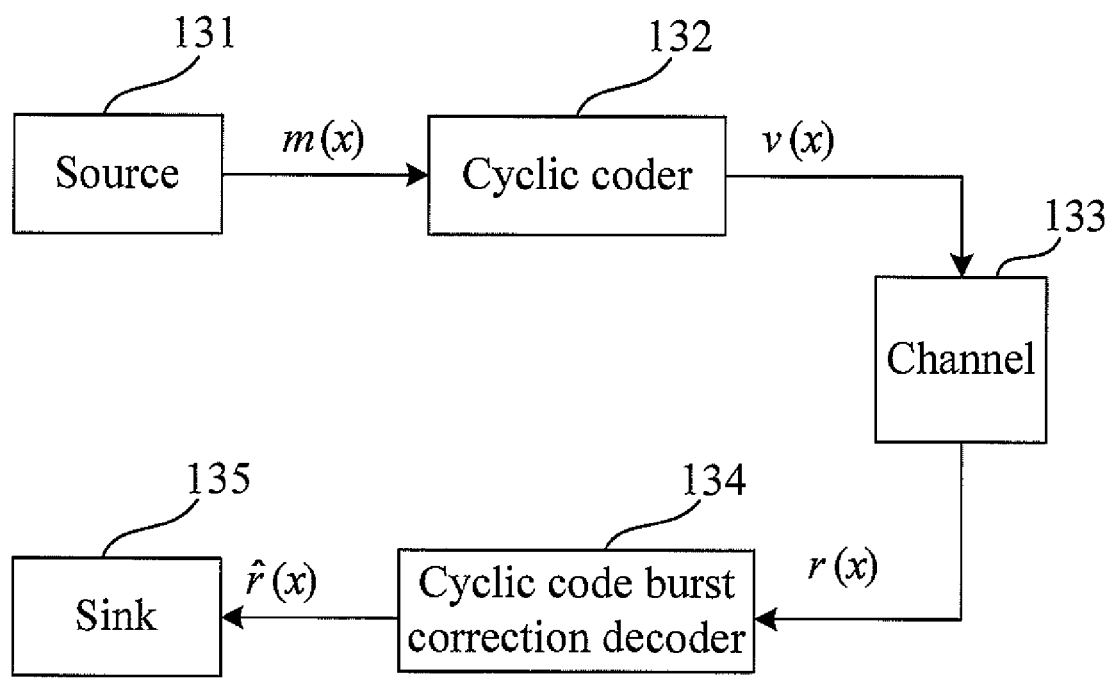
FIG. 13 shows a structure of a burst correction communication system in an embodiment of the present invention.

FIG. 13 shows a structure of a burst correction communication system in an embodiment of the present invention. The communication system includes a source 131, a cyclic code coder 132, a burst channel 133, a cyclic code burst correction decoder 134, and a sink 135. In this embodiment, the data m(x) generated by the source 131 is fed into the cyclic code coder 132 for encoding and generating a codeword v(x). The coded codeword receives interference in the burst channel 133 and generates a burst. The interfered codeword is r(x). This codeword is fed into the cyclic code burst correction decoder 134 for decoding, and then the decoded codeword r̂(x) is obtained. Afterward, the decoded codeword is fed into the sink 135.

Figure 14:
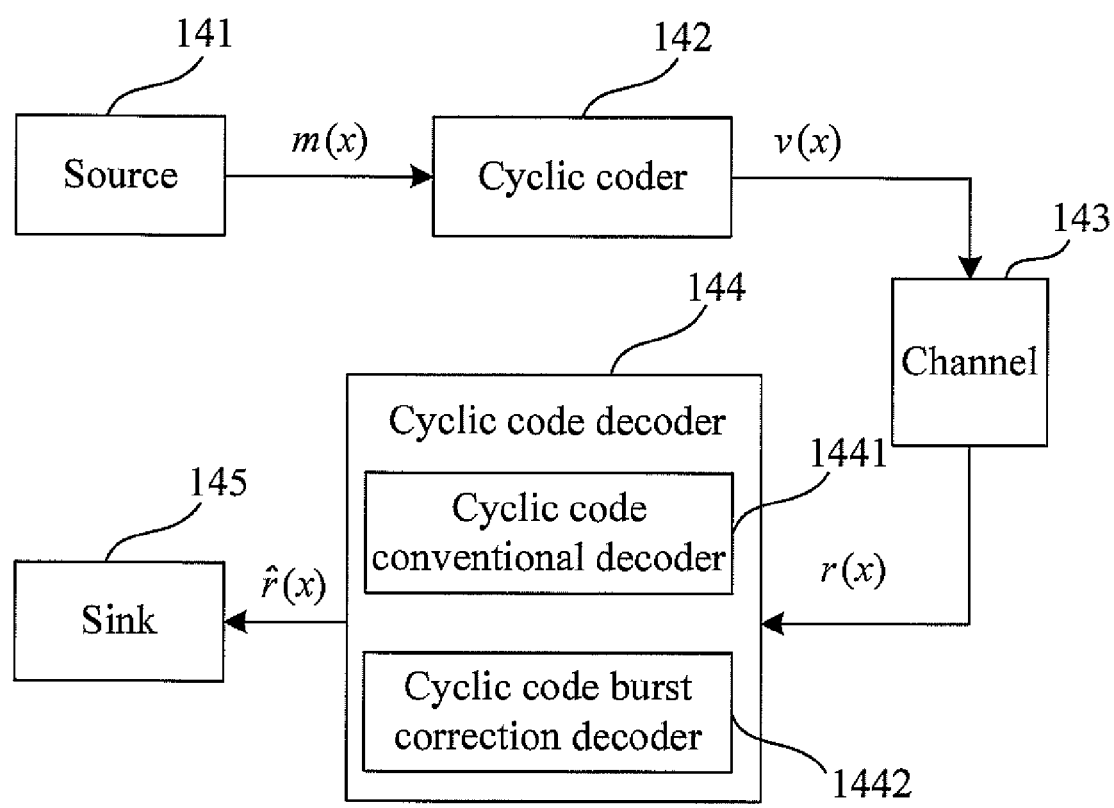
FIG. 14 shows another structure of a burst correction communication system in an embodiment of the present invention.

FIG. 14 shows a structure of another burst correction communication system in an embodiment of the present invention. In FIG. 14, the cyclic decoder 144 is composed of a cyclic code conventional decoder 1441 and a cyclic code burst correction decoder 1442 disclosed herein. The information m(x) generated by the source 141 passes through the cyclic code coder 142 and forms a codeword v(x), and then enters the channel 143 for transmission. The channel 143 may be a burst channel or a random channel. The codeword r(x) that receives interference on the channel 143 is fed into the cyclic code decoder 144. It may be fed into a cyclic code conventional decoder 1441 or a cyclic code burst correction decoder 1442, or both of them, depending on the specific channel model. After being decoded by the cyclic code decoder 144, the codeword r̂(x) is fed into the sink 145.

Figure 15:
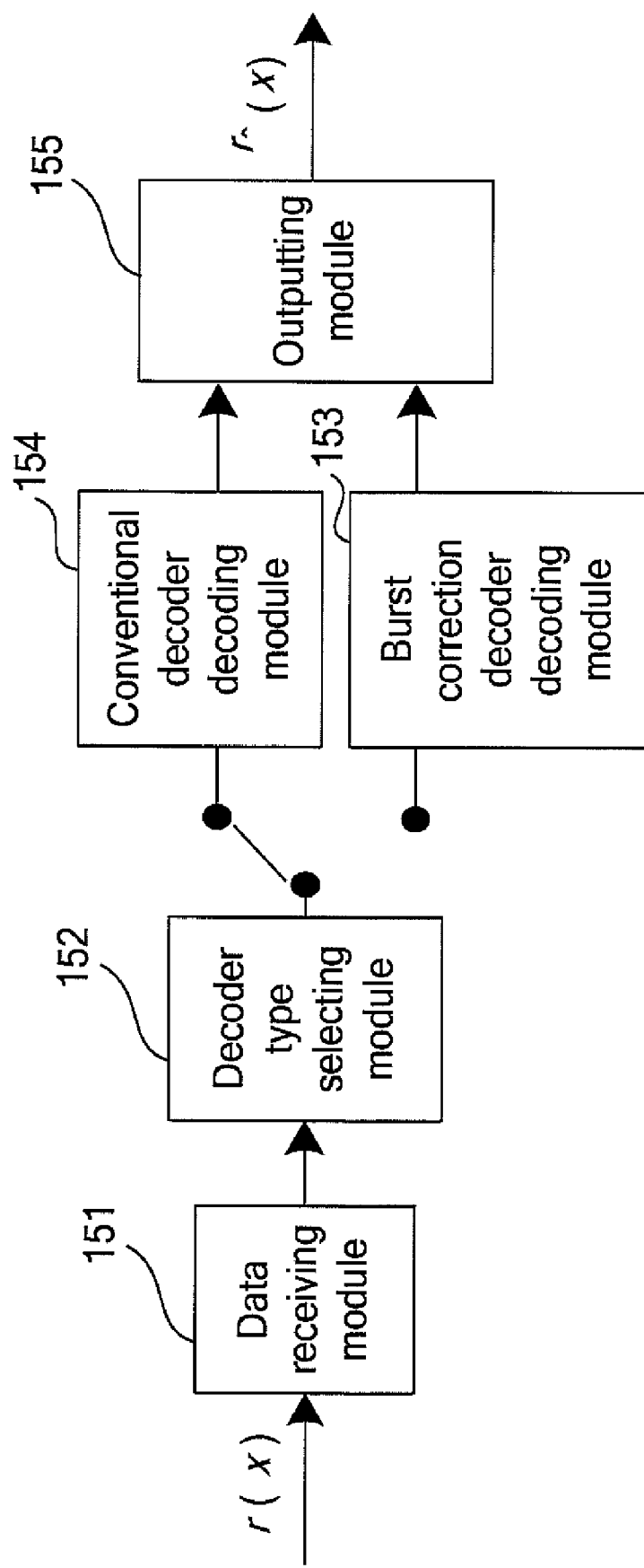
FIG. 15 shows a structure of a decoding apparatus in an embodiment of the present invention.

FIG. 15 shows a structure of a decoding apparatus in an embodiment of the present invention. The decoding apparatus includes:

a data receiving module 151, configured to receive a codeword sent through a channel;

a decoder type selecting module 152, configured to select a decoder according to type of the channel; and a burst correction decoder decoding module 153, configured to: construct a check matrix according to the received codeword after the decoder type selecting module 152 selects a burst correction decoder; calculate a correction vector according to the received codeword and the check matrix, where the check matrix is an Overlapped Quasi Dual Diagonal Matrix; determine a length and position of the burst according to a longest zero element vector between two nonzero elements in the correction vector when the correction vector is nonzero; calculate out an error mode according to the correction vector that is determined according to the length and the position of the burst, obtain an error mode polynomial according to the error mode, correct the received codeword according to the error mode polynomial, and obtain a corrected codeword polynomial.

The decoding apparatus may further include: a conventional decoder decoding module 154, configured to decode the codeword received by the data receiving module 151 after the decoder type selecting module 152 selects a conventional decoder.

The decoding apparatus may further include: an outputting module 155, configured to output the codeword decoded by the burst correction decoder decoding module 153 or the conventional decoder decoding module 154.

In this embodiment, the data from the channel enters the data receiving module 151 first, and then the decoder type selecting module 152 is started. The decoder type selecting module 152 selects a proper decoder according to the channel type. For example, when the channel model of the channel in a specific period is burst channel, or the channel model in a specific system is random channel, the decoder type selecting module chooses to send the received data to the conventional decoder decoding module 154 for decoding; when the channel model of the channel in a specific period is burst channel, or the channel model in a specific system is burst channel, the decoder type selecting module selects the burst correction decoder decoding module 155 for decoding. Afterward, the decoded data is fed into the outputting module 155 for outputting.

Figure 16:
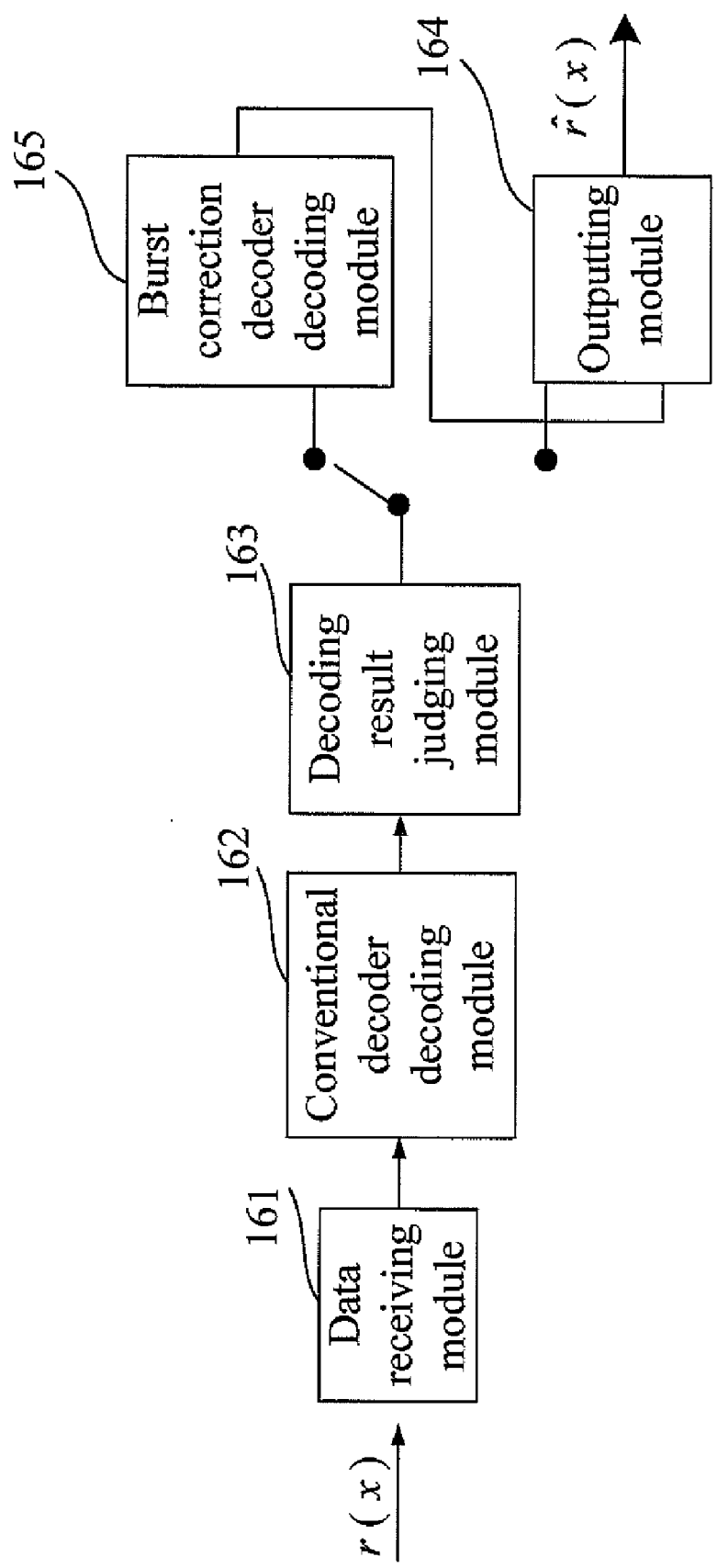
FIG. 16 shows a structure of another decoding apparatus in an embodiment of the present invention.

FIG. 16 shows a structure of another decoding apparatus in an embodiment of the present invention. The decoding apparatus includes: a data receiving module 161, a conventional decoder decoding module 162, a decoding result judging module 163, an outputting module 164, and a burst correction decoder decoding module 165.

The data receiving module 161 is configured to receive a codeword sent through a channel.

The conventional decoder decoding module 162 is configured to decode the codeword received by the data receiving module 161.

The decoding result judging module 163 is configured to: send the codeword decoded by the conventional decoder decoding module 162 to the outputting module 164 for outputting after the conventional decoder decoding module 162 succeeds in decoding; and send the codeword decoded by the conventional decoder decoding module 162 to the burst correction decoder decoding module 165 for decoding after the conventional decoder decoding module 162 fails in decoding.

The burst correction decoder decoding module 165 is configured to: receive the codeword sent by the decoding result judging module 163; construct a check matrix according to the received codeword; calculate a correction vector according to the received codeword and the check matrix, where the check matrix is an Overlapped Quasi Dual Diagonal Matrix; determine a length and position of the burst according to a longest zero element vector between two nonzero elements in the correction vector when the correction vector is nonzero; calculate out an error mode according to the correction vector that is determined according to the length and the position of the burst, obtain an error mode polynomial according to the error mode, correct the received codeword according to the error mode polynomial, and obtain a corrected codeword polynomial.

The outputting module 164 is configured to output the codeword decoded by the burst correction decoder decoding module 165 or the conventional decoder decoding module 162.

In this embodiment, the data receiving module 161 sends the data received from the channel to the conventional decoder decoding module 162 for decoding. If the decoding succeeds, the decoding result judging module 163 sends the decoded data to the outputting module 164 for outputting. If the decoding fails, the decoding result judging module 163 sends the data that passes through the conventional decoder decoding module 162 to the burst correction decoder decoding module 165 for decoding, and sends the decoded data to the outputting module 164 for outputting.

Figure 17:
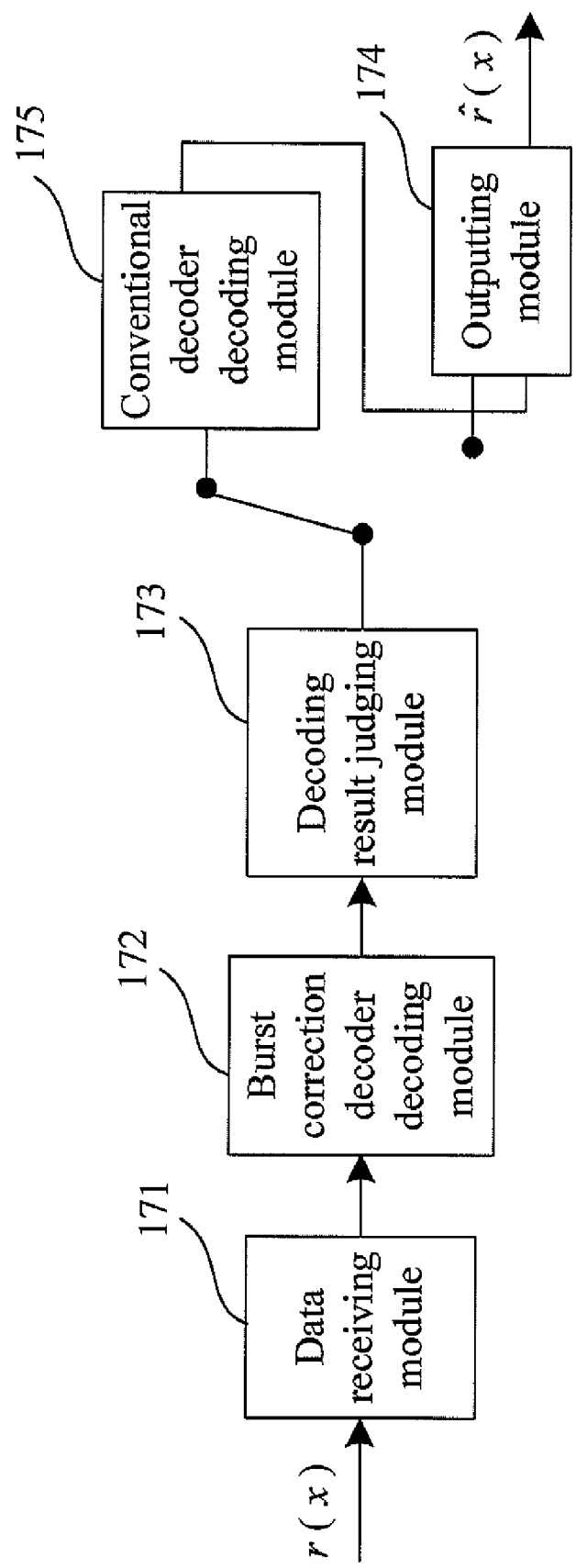
FIG. 17 shows a structure of another decoding apparatus in an embodiment of the present invention.

FIG. 17 shows a structure of another decoding apparatus in an embodiment of the present invention. The decoding apparatus includes: a data receiving module 171, a burst correction decoder decoding module 172, a decoding result judging module 173, an outputting module 174, and a conventional decoder decoding module 175.

The data receiving module 171 is configured to receive a codeword sent through a channel.

The burst correction decoder decoding module 172 is configured to: construct a check matrix according to the codeword received by the data receiving module 171; calculate a correction vector according to the received codeword and the check matrix, where the check matrix is an Overlapped Quasi Dual Diagonal Matrix; determine a length and position of the burst according to a longest zero element vector between two nonzero elements in the correction vector when the correction vector is nonzero; calculate out an error mode according to the correction vector that is determined according to the length and the position of the burst, obtain an error mode polynomial according to the error mode, correct the received codeword according to the error mode polynomial, and obtain a corrected codeword polynomial.

The decoding result judging module 173 is configured to: send the codeword decoded by the burst correction decoder decoding module 172 to the outputting module 174 for outputting after the burst correction decoder decoding module 172 succeeds in decoding; and send the codeword decoded by the burst correction decoder decoding module 172 to the conventional decoder decoding module 175 for decoding after the burst correction decoder decoding module 172 fails in decoding. The outputting module 174 is configured to output the codeword decoded by the burst correction decoder decoding module 172 or the conventional decoder decoding module 175.

In this embodiment, the data receiving module 171 sends the data received from the channel to the burst correction decoder decoding module 172 for decoding. If the decoding succeeds, the decoding result judging module 173 sends the decoded data to the outputting module 174 for outputting. If the decoding fails, the decoding result judging module 173 sends the data that passes through the burst correction decoder decoding module 172 to the conventional decoder decoding module 175 for decoding, and sends the decoded data to the outputting module 174 for outputting.

The PBC-based method for cyclic codes in this embodiment can correct more bursts than the conventional cyclic code decoding method. The conventional cyclic code decoding method can correct only the bursts within the correction range, and the upper limit of the correction capability is the Reiger bound. The PBC-based method in this embodiment can correct bursts longer than the Reiger bound at high probability.

The following describes the performance of the burst correction method in this embodiment, taking the RS code and the BCH code as an example. For RS (255, 223), the burst correction method in the prior art can correct the burst whose length (L) is not greater than 121 bits; the method disclosed in this embodiment can correct the burst whose length (L) is not greater than 214 bits at a probability less than 2-30. For BCH (2047, 1794), the burst correction method in the prior art can correct the burst whose length (L) is not greater than 23 bits; the method disclosed in this embodiment can correct the burst whose length (L) is not greater than 224 bits at a probability less than 2-30.

The foregoing modules may be distributed on one apparatus or multiple apparatuses. The foregoing modules may be combined into one module, or split into multiple submodules.

After reading the foregoing embodiments, those skilled in the art are clearly aware that the present invention may be implemented through hardware, or through software in addition to a necessary universal hardware platform. The technical solution under the present invention may be embodied as a software product. The software product may be stored in a non-volatile storage medium (such as CD-ROM, USB flash disk, or mobile hard disk), and may include several instructions that enable a computer device (such as personal computer, server, or network device) to perform the methods specified in any embodiment of the present invention.

What is claimed is:

1. A burst correction method, comprising:
   calculating a correction vector according to a received codeword and a check matrix, wherein the check matrix is an Overlapped Quasi Dual Diagonal Matrix;
   determining a length and position of a burst according to a longest zero element vector between two nonzero elements in the correction vector when the correction vector is nonzero; and
   calculating out an error mode according to the correction vector and length of the burst, obtaining an error mode polynomial according to the error mode, correcting the received codeword according to the error mode polynomial, and obtaining a corrected codeword polynomial.

2. The burst correction method according to claim 1, wherein:
   the check matrix is composed of cyclic codes whose codeword length is N and whose information length is K, and the check matrix comprises (2N−K) rows and N columns; and elements of the check matrix are 0 in an area between a main diagonal of an N×N matrix formed by first N rows of the check matrix and a main diagonal of the N×N matrix formed by last N rows of the check matrix.

3. The burst correction method according to claim 2, wherein:
last s rows and last s columns of the check matrix of the cyclic codes whose codeword length is N and whose information length is K are deleted to obtain a check matrix of shortened cyclic codes whose codeword length is N−s and whose information length is K−s if the cyclic codes are the shortened cyclic codes, a codeword length of the shortened cyclic codes is N−s, and an information length of the shortened cyclic codes is K−s.

4. The burst correction method according to claim 2, wherein the calculating the error mode according to the correction vector and the burst length comprises:
calculating a current error mode through iteration according to coefficients of a check polynomial of the cyclic codes, the length of the burst, and a part of the correction vector which is determined according to the position of the burst, and a previous error mode calculated out.

5. The burst correction method according to claim 4, wherein:
if the coefficients of the check polynomial are $h_0, h_1, \ldots$, the position of a last bit of the burst is 1, and the length of the burst is L, the part of the correction vector that is determined according to the position of the burst is $s_{l-1-j}$; and a formula for calculating the current error mode through iteration according to the correction vector, the length of the burst, and the previous error mode calculated out is:

$$e_{l-1-j} = h_0^{-1}\left(\sum_{i=-1}^{j-1} h_{j-i}e_{l-1-i} + s_{l-1-j}\right), \text{ wherein } j = -1, 0, \ldots, L-2.$$

6. The burst correction method according to claim 2, wherein the calculating the error mode according to the correction vector and the burst length comprises:
obtaining a check coefficient tap vector through iteration according to the coefficients of a check polynomial of the cyclic codes; and
calculating error modes concurrently according to the check coefficient tap vector and the correction vector that is determined according to the length and the position of the burst.

7. The burst correction method according to claim 6, wherein:
if the coefficients of the check polynomial are h0, h1, ..., and the check coefficient tap vector is H, formulas for obtaining the check coefficient tap vector through iteration according to the coefficients of the check polynomial of the cyclic codes are:

$$H_0 = h_0^{-1} = 1$$

$$H_i = h_0^{-1}\sum_{j=1}^{i} h_j H_{i-j}, \text{ wherein } i = 1, 2, \ldots, N-K-1.$$

8. The burst correction method according to claim 7, wherein:
if the position of a last bit of the burst is 1, the length of the burst is L, and the correction vector is $s_{l-1-j}$, a formula for calculating the error modes concurrently is:

$$e_{l-1-j} = \left(\sum_{i=-1}^{j-1} H_{j-i}s_{l-1-j}\right), \text{ wherein } j = -1, 0, \ldots, L-2.$$

9. The burst correction method according to claim 2, wherein:
if coefficients of a generation polynomial of cyclic codes are $g_i$, the position of a last bit of the burst is 1, the length of the burst is L, and the correction vector is $s_{l-1-j}$, a formula for calculating the error modes concurrently is:

$$e_{l-1-j} = \left(\sum_{i=-1}^{j-1} g_{j-i}s_{l-1-i}\right), \text{ wherein } j = -1, 0, \ldots, L-2.$$

10. A burst correction decoder, comprising:
a check matrix generating module, configured to construct a check matrix, wherein the check matrix is an Overlapped Quasi Dual Diagonal Matrix;
a corrector generating module, configured to calculate a correction vector according to a received codeword and the check matrix constructed by the check matrix generating module;
a burst position and length detecting module, configured to determine a position of a burst according to a longest zero element vector between two nonzero elements in the correction vector when the correction vector generated by the corrector generating module is nonzero;
an error mode calculating module, configured to calculate out an error mode according to the correction vector and a burst length determined by the burst position and length detecting module, and obtain an error mode polynomial according to the error mode; and
an error correcting module, configured to correct the received codeword according to the error mode polynomial obtained by the error mode calculating module, and obtain a corrected codeword polynomial;
wherein at least one of the check matrix generating module, the corrector generating module, the burst position and length detecting module, the error mode calculating module or the error correcting module, is a hardware module.

11. The burst correction decoder according to claim 10, wherein the error mode calculating module comprises:
a serial calculating submodule, configured to calculate a current error mode through iteration according to coefficients of a check polynomial of cyclic codes, length of the burst, the length of the burst, and a part of the correction vector determined according to the position of the burst, and a previous error mode calculated out.

12. The burst correction decoder according to claim 10, wherein the error mode calculating module comprises:
a vector calculating submodule, configured to obtain a check coefficient tap vector through iteration according to coefficients of a check polynomial of cyclic codes; and
a first concurrent calculating submodule, configured to calculate error modes concurrently according to the check coefficient tap vector obtained by the vector calculating submodule, the correction vector, and the burst length.

13. The burst correction decoder according to claim 10, wherein the error mode calculating module comprises:

a generation polynomial coefficient inputting submodule, configured to input coefficients of a generation polynomial of cyclic codes; and a second concurrent calculating submodule, configured to calculate the error modes concurrently according to the generation polynomial coefficients input by the generation polynomial coefficient inputting submodule, the correction vector, and the burst length.

14. A decoding apparatus, comprising:

a data receiving module, configured to receive a codeword sent through a channel;

a decoder type selecting module, configured to select a decoder according to a type of the channel; and a burst correction decoder decoding module, configured to: construct a check matrix after the decoder type selecting module selects a burst correction decoder; calculate a correction vector according to the received codeword and the check matrix, wherein the check matrix is an Overlapped Quasi Dual Diagonal Matrix; determine a length and position of a burst according to a longest zero element vector between two nonzero elements in the correction vector when the correction vector is nonzero; calculate out an error mode according to the correction vector and the length of the burst, obtain an error mode polynomial according to the error mode, correct the received codeword according to the error mode polynomial, and obtain a corrected codeword polynomial.

15. The decoding apparatus according to claim 14, further comprising:

a conventional decoder decoding module, configured to decode the codeword received by the data receiving module after the decoder type selecting module selects the conventional decoder.

16. The decoding apparatus according to claim 14, further comprising:

an outputting module, configured to output the codeword decoded by the burst correction decoder decoding module or the conventional decoder decoding module.

17. The decoding apparatus according to claim 14, wherein:

the conventional decoder decoding module is configured to decode the codeword received by the data receiving module; and the decoding result judging module is configured to: send the codeword decoded by the conventional decoder decoding module to the outputting module for outputting after the conventional decoder decoding module succeeds in decoding; and send the codeword decoded by the conventional decoder decoding module to the burst correction decoder decoding module for decoding if the conventional decoder decoding module fails in decoding.

18. The decoding apparatus according to claim 17, further comprising:

an outputting module, configured to output the codeword decoded by the burst correction decoder decoding module or the conventional decoder decoding module.

19. A decoding apparatus, comprising a data receiving module, a burst correction decoder decoding module, a decoding result judging module, an outputting module, and a conventional decoder decoding module, wherein:

the data receiving module is configured to receive a codeword sent through a channel;

the burst correction decoder decoding module is configured to: construct a check matrix; calculate a correction vector according to the codeword received by the data receiving module and the check matrix, wherein the check matrix is an Overlapped Quasi Dual Diagonal Matrix; determine a length and position of a burst according to a longest zero element vector between two nonzero elements in the correction vector when the correction vector is nonzero; calculate out an error mode according to the length of the burst and a part of the correction vector that is determined according to the position of the burst, obtain an error mode polynomial according to the error mode, correct the received codeword according to the error mode polynomial, and obtain a corrected codeword polynomial; and the decoding result judging module is configured to: send the codeword decoded by the burst correction decoder decoding module to the outputting module for outputting if the burst correction decoder decoding module succeeds in decoding; and send the codeword decoded by the burst correction decoder decoding module to the conventional decoder decoding module for decoding if the burst correction decoder decoding module fails in decoding.

20. The decoding apparatus according to claim 19, wherein:

the conventional decoder decoding module is configured to decode the codeword sent by the decoding result judging module; and the outputting module is configured to output the codeword decoded by the burst correction decoder decoding module or the conventional decoder decoding module.

21. A non-transitory computer-readable medium having computer executable instructions that, when executed by a computer, cause the computer to:

calculate a correction vector according to a received codeword and a check matrix, wherein the check matrix is an Overlapped Quasi Dual Diagonal Matrix determine a length and position of a burst according to a longest zero element vector between two nonzero elements in the correction vector when the correction vector is nonzero; and calculate out an error mode according to the correction vector and length of the burst, obtaining an error mode polynomial according to the error mode, correcting the received codeword according to the error mode polynomial, and obtaining a corrected codeword polynomial.

* * * * *